United States Patent
Ning et al.

(10) Patent No.: US 12,224,722 B2
(45) Date of Patent: Feb. 11, 2025

(54) METHODS AND APPARATUS FOR SUPPORTING LINEARIZATION ON POWER COMBINED POWER AMPLIFIERS

(71) Applicant: Mixcomm, Inc., Chatham, NJ (US)

(72) Inventors: Kang Ning, Lawrence, NJ (US); Harish Krishnaswamy, New York, NY (US)

(73) Assignee: Mixcomm, Inc., Chatham, NJ (US)

( * ) Notice: Subject to any disclaimer, the term of this patent is extended or adjusted under 35 U.S.C. 154(b) by 636 days.

(21) Appl. No.: 17/509,925

(22) Filed: Oct. 25, 2021

(65) Prior Publication Data

US 2022/0131509 A1 Apr. 28, 2022

Related U.S. Application Data (60) Provisional application No. 63/106,284, filed on Oct. 27, 2020.

(51) Int. Cl.
   H03F 1/56       (2006.01)
   H03F 3/24       (2006.01)

(52) U.S. Cl.
   CPC ............ *H03F 3/245* (2013.01); *H03F 1/565* (2013.01); *H03F 2200/543* (2013.01); *H03F 2203/21142* (2013.01)

(58) Field of Classification Search
   CPC .... H03F 3/245; H03F 1/565; H03F 2200/543; H03F 2203/21142; H03F 1/0288
   USPC .............................................. 330/295, 124 R
   See application file for complete search history.

(56) References Cited

U.S. PATENT DOCUMENTS

| | | | |
|---|---|---|---|
| 6,054,906 | A | 4/2000 | Kim |
| 9,413,309 | B1 | 8/2016 | Zhao et al. |
| 2016/0164553 | A1 | 6/2016 | Kurihara |
| 2017/0019847 | A1 | 1/2017 | Han et al. |
| 2018/0006611 | A1 | 1/2018 | de Jong et al. |

(Continued)

FOREIGN PATENT DOCUMENTS

WO       2020166629 A1    8/2020

OTHER PUBLICATIONS

Z. Zong et al., "A 28GHZ Voltage-Combined Doherty Power Amplifier with a Compact Transformer-based Output Combiner in 22nm FD-SOI," 2020 IEEE Radio Frequency Integrated Circuits Symposium (RFIC), Los Angeles, CA, USA, 2020, pp. 299-302, doi: 10.1109/RFIC49505.2020.9218280.

(Continued)

*Primary Examiner* — Andrea Lindgren Baltzell
*Assistant Examiner* — Khiem D Nguyen
(74) *Attorney, Agent, or Firm* — Straub & Straub; Michael P. Straub; Stephen T. Straub (57) ABSTRACT

Methods and apparatus for implementing a power amplifier circuit assembly an uneven power splitter which feeds two power amplifiers of different amplifier classes are described. By supplying different amounts of power to different amplifier circuits having different performance curves, an overall combined amplifier performance having a relatively uniform, e.g., flat, performance curve over a wide range of frequencies is achieved. In at least some embodiments one of the amplifiers is a class B power amplifier and the other amplifier is a class C power amplifier. In some but not necessarily all embodiments a phase shift is introduced on a signal path to one of the power amplifiers to compensate for a difference in phase shifts introduced by the power amplifiers which are used in parallel.

17 Claims, 8 Drawing Sheets

(56) References Cited

U.S. PATENT DOCUMENTS

2018/0034419 A1     2/2018   Moronval
2018/0294777 A1   10/2018   Yang et al.

OTHER PUBLICATIONS

J. Tsai and T. Huang, "A 38-46 GHz MMIC Doherty Power Amplifier Using Post-Distortion Linearization," in IEEE Microwave and Wireless Components Letters, vol. 17, No. 5, pp. 388-390, May 2007, doi: 10.1109/LMWC.2007.895726.

B. Wicks, E. Skafidas and R. Evans, "A 60-GHz fully-integrated Doherty power amplifier based on 0.13-μm CMOS process," 2008 IEEE Radio Frequency Integrated Circuits Symposium, Atlanta, GA, 2008, pp. 69-72, doi: 10.1109/RFIC.2008.4561388.

E. Kaymaksut, D. Zhao and P. Reynaert, "Transformer-Based Doherty Power Amplifiers for mm-Wave Applications in 40-nm CMOS," in IEEE Transactions on Microwave Theory and Techniques, vol. 63, No. 4, pp. 1186-1192, Apr. 2015, doi: 10.1109/TMTT.2015.2409255.

M. Özen, N. Rostomyan, K. Aufinger and C. Fager, "Efficient Millimeter Wave Doherty PA Design Based on a Low-Loss Combiner Synthesis Technique," in IEEE Microwave and Wireless Components Letters, vol. 27, No. 12, pp. 1143-1145, Dec. 2017, doi: 10.1109/LMWC.2017.2763739.

M. Tanio, K. Ning and J. F. Buckwalter, "A 60-GHz Symmetric Doherty Power Amplifier with 20.4% 6-dB Back-off Efficiency," 2019 49th European Microwave Conference (EuMC), Paris, France, 2019, pp. 559-562, doi: 10.23919/EuMC.2019.8910860.

A. Agah, H. Dabag, B. Hanafi, P. M. Asbeck, J. F. Buckwalter and L. E. Larson, "Active Millimeter-Wave Phase-Shift Doherty Power Amplifier in 45-nm SOI CMOS," in IEEE Journal of Solid-State Circuits, vol. 48, No. 10, pp. 2338-2350, Oct. 2013, doi: 10.1109/JSSC.2013.2269854.

H. T. Nguyen, T. Chi, S. Li and H. Wang, "A Linear High-Efficiency Millimeter-Wave CMOS Doherty Radiator Leveraging Multi-Feed On-Antenna Active Load Modulation," in IEEE Journal of Solid-State Circuits, vol. 53, No. 12, pp. 3587-3598, Dec. 2018, doi: 10.1109/JSSC.2018.2880186.

W. Hallberg, M. Özen, D. Gustafsson, K. Buisman and C. Fager, "A Doherty Power Amplifier Design Method for Improved Efficiency and Linearity," in IEEE Transactions on Microwave Theory and Techniques, vol. 64, No. 12, pp. 4491-4504, Dec. 2016, doi: 10.1109/TMTT.2016.2617882.

Rostomyan Narek et al: A Ka-Band Asymmetric Dual Input CMOS SOI Doherty Power Amplifier with 25 dBm Output Power and High Back-Off Efficiency, 2019 IEEE Topical Conference on RF/Microwave Power Amplifiers for Radio and Wireless Applications (PAWR), IEEE, Jan. 20, 2019, pp. 1-4.

Rostomyan Narek et al: 28 GHz Doherty Power Amplifier in CMOS SOI With 28% Back-Off PAE, IEEE Microwave and Wireless Components Letters, IEEE Service Center, New York, NY, US, vol. 28, No. 5, May 1, 2018, pp. 446-448.

International Search Report and Written Opinion of the International Searching Authority from PCT/US2021/056660, mail date Jan. 21, 2022, 1-9 pages.

METHODS AND APPARATUS FOR SUPPORTING LINEARIZATION ON POWER COMBINED POWER AMPLIFIERS

RELATED APPLICATIONS

The present application claims the benefit of U.S. Provisional Application Ser. No.: 63/106,284 filed Oct. 27, 2020 which is hereby expressly incorporated by reference in its entirety.

FIELD

The present application relates to methods and apparatus for implementing and using power amplifiers in combination, and more particularly to methods and apparatus for implementing a power amplifier circuit which supports linearization on power combined power amplifiers.

BACKGROUND

Figure 1:
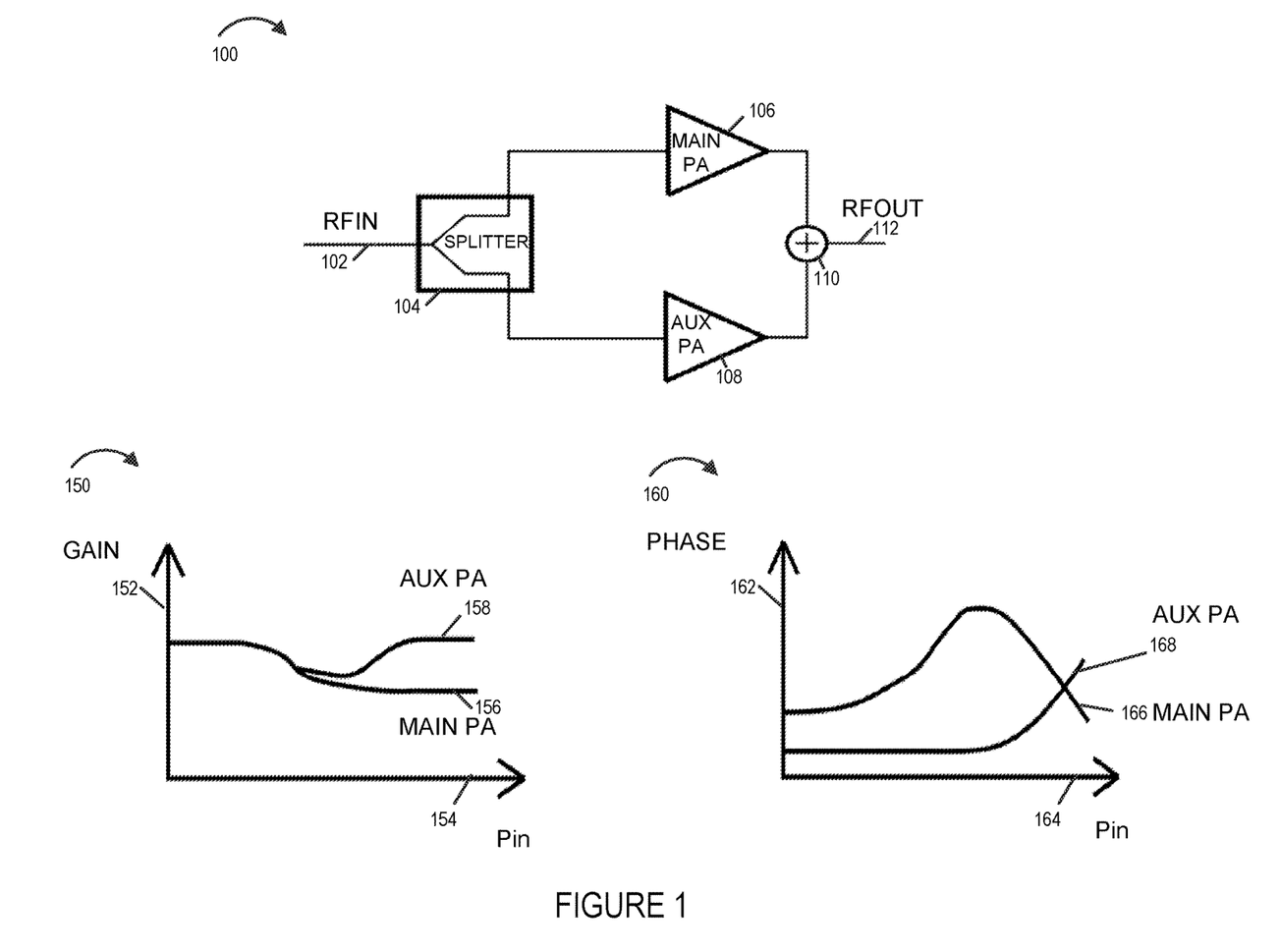
FIG. 1 includes a drawing of a power amplifier (PA) circuit including a power splitter, a main power amplifier and an auxiliary power amplifier, a gain vs input power plot corresponding to power amplifier circuit, and a phase vs input power plot corresponding to the power amplifier circuit.

FIG. 1 includes a drawing of a power amplifier (PA) circuit 100, a gain vs input power (Pin) plot 150 corresponding to power amplifier circuit 100, and a phase vs input power (Pin) plot 160 corresponding to the power amplifier circuit 100.

Power amplifier circuit 100 includes a power splitter 104, a main power amplifier 106, an auxiliary (aux) power amplifier 108, and a combiner 110 coupled together as shown. The input to the splitter 104 receives RFIN signal 102. The power splitter 104 splits the received signal. A first output of the power splitter 104 outputs a signal to the input of the main output amplifier. A second output of the power splitter 104 outputs a signal to the input of the auxiliary power amplifier 108. Each of the power amplifiers (106, 108) amplifies a received signal and outputs a signal to the input of combiner 110. The combiner 110 combines an output signal from the main PA 106 with an output signal from the aux PA 108, generating RFOUT signal 112.

Vertical axis 152 of plot 150 represents gain while horizontal axis 154 of plot 150 represents input power (Pin). Line 156 represents the gain vs input power characteristic of the main PA 106, while line 158 represents the gain vs input power characteristic of the auxiliary PA 108.

Vertical axis 162 of plot 160 represents phase while horizontal axis 164 of plot 160 represents input power (Pin). Line 166 represents the phase vs input power characteristic of the main PA 106, while line 168 represents the phase vs input power characteristic of the auxiliary PA 108.

In typical known power combined PA topologies that enhance efficiency under backoff, such as the Doherty PA, two asymmetrical PAs are used, but because of that, the AM-AM (gain) performance is not flat with input power. The AM-PM performance for the two PAs are also typically different, so that the AM-PM of the combined PA is not flat. Conventional ways to linearize the power-combined PA are to use analog predict distortion (APD) or digital pre-distortion (DPD). However, these conventional approaches sacrifice efficiency and are not compatible with mmWave large scale arrays. There is also a need to achieve linearized operation of a power combiner circuit over wide bandwidths.

Based on the above, there is a need for new methods and apparatus in power amplifier circuity which allow for asymmetrical power amplifiers to be used in combination efficiently. It would be beneficial if at least some of these new methods and apparatus supported linear combined power amplifier operation for applications including mmWave large scale arrays and/or support wide bandwidths.

SUMMARY

Methods and apparatus for implementing a power amplifier circuit assembly an uneven power splitter which feeds two power amplifiers of different amplifier classes are described. By supplying different amounts of power to different amplifier circuits having different performance curves, a overall combined amplifier performance having a relatively uniform, e.g., flat, performance curve over a wide range of frequencies is achieved. In at least some embodiments one of the amplifiers is a class B power amplifier and the other amplifier is a class C power amplifier. In some but not necessarily all embodiments a phase shift is introduced on a signal path to one of the power amplifiers to compensate for a difference in phase shifts introduced by the power amplifiers which are used in parallel.

The power amplifier assemblies of the present invention with unequal power slitters are well suited for microwave applications including for use in large scale antenna arrays where different power amplifier assemblies are used to amplify signals supplied to different antenna elements of the antenna array or received from different antenna elements of the antenna array.

An exemplary power amplifier circuit assembly in accordance with some embodiments, of the present invention includes an uneven power splitter which feeds two power amplifiers, e.g. a main amplifier (e.g., class B amplifier) and an auxiliary amplifier (e.g., a class C amplifier) of a power combined power amplifier. Because of the uneven power splitting between the main and auxiliary power amplifiers, the turning on of the auxiliary PA can be accurately controlled by the power split ratio. By turning on the auxiliary PA just when the main PA compresses, the overall gain of the power combined amplifier can be advantageously controlled to be flat or relatively flat over a wide bandwidth. In some embodiments, the uneven power splitter is co-designed with the PAs to accommodate PA input impedance(s) which do not match the output impedance of the source to the power splitter. This approach of accommodating different PA input impedances can reduce the number of components in an amplifier's matching network thus reducing power loss and reducing the amount of circuit board or chip area needed for implementation as compared to some other implementations. Additionally, in some embodiments, an additional phase shifter is optionally included, e.g., within the uneven power splitter, along one of the paths feeding an input to one of the main amplifier or auxiliary amplifier to adjust phase imbalance. Power amplifier circuits including an uneven power splitter, implemented in accordance with one or more features of the present invention, are well suited for use in mmWave large-scale array applications.

An exemplary power amplifier circuit assembly, in accordance with some embodiments, includes an uneven power splitter including a power splitter signal input (e.g., Port 1) for receiving a signal to be amplified, a first power splitter output (e.g., Port 2) and a second power splitter output (e.g., Port 3), said uneven power splitter providing different amounts of power from an input signal received at said power splitter signal input to said first and second power splitter outputs; a first power amplifier having a first power amplifier input and a first power amplifier output, the first power amplifier input being coupled to the first power splitter output; and a second power amplifier having a second power amplifier input coupled to the second power splitter output and a second power amplifier output, said first power amplifier output and the second power amplifier output being coupled to each other and to a signal output of the power amplifier circuit assembly, said second power amplifier being a different class amplifier than said first power amplifier.

While various features discussed in the summary are used in some embodiments it should be appreciated that not all features are required or necessary for all embodiments and the mention of features in the summary should in no way be interpreted as implying that the feature is necessary or critical for all embodiments.

Numerous additional features and embodiments are discussed in the detailed description which follows.

DETAILED DESCRIPTION

Figure 2:
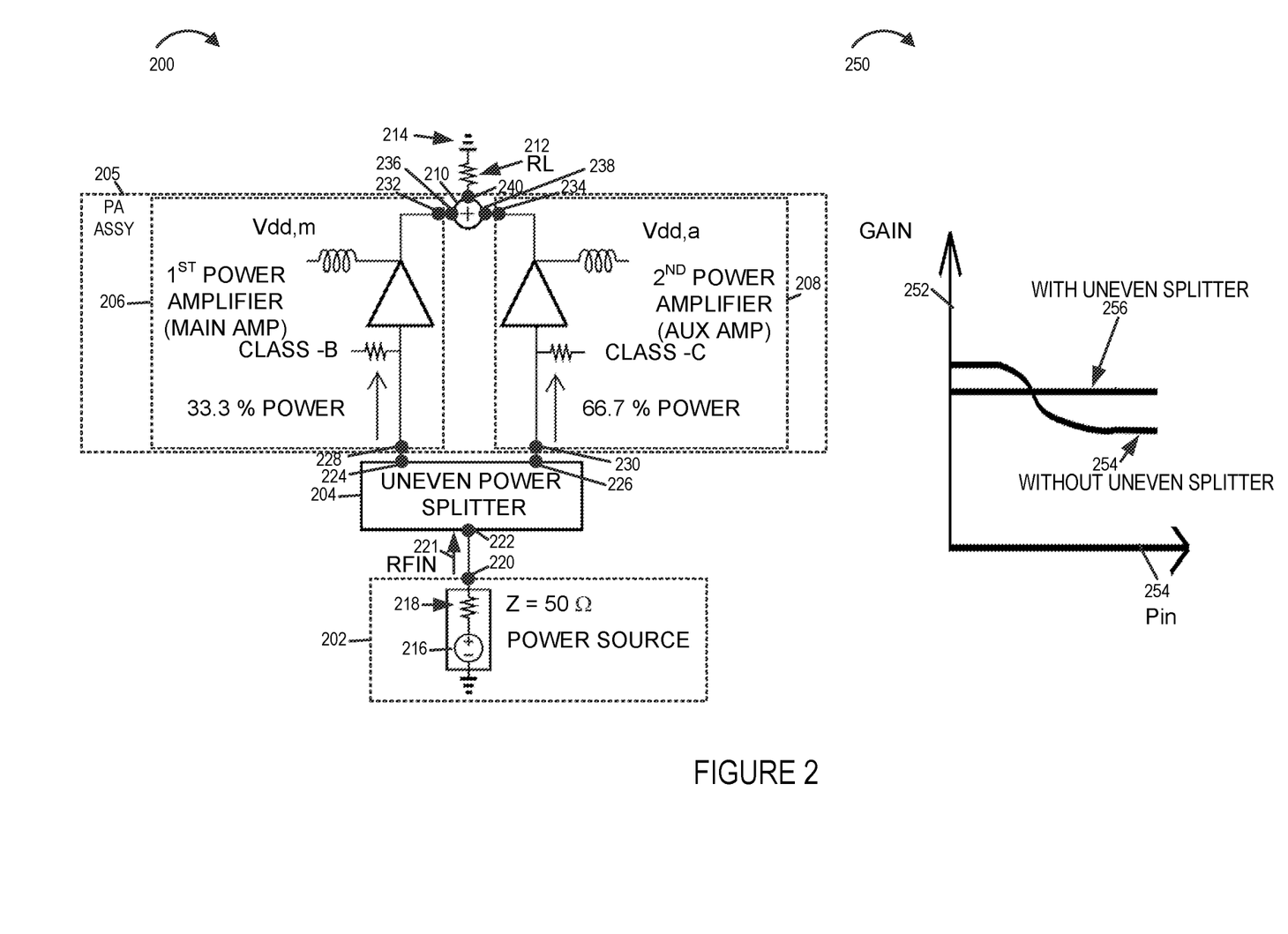
FIG. 2 includes a drawing of an exemplary power amplifier circuit assembly including an uneven splitter in accordance with an exemplary embodiment.

FIG. 2 includes a drawing of an exemplary power amplifier circuit assembly 200 in accordance with an exemplary embodiment. Exemplary power amplifier circuit assembly 200 includes an uneven power splitter 204 for AM-AM linearization. AM stands for amplitude modulation. AM-AM represents, for the input amplitude to output amplitude conversion, a measure of the deviation of gain. Exemplary power amplifier circuit assembly 200 includes a power source/signal source 202, uneven power splitter 204, a 1st power amplifier 206, a 2nd power amplifier 208, a combiner 210 and load resistance RL 210 coupled together and to ground 214 as shown. The 1st power amplifier 206, 2nd power amplifier 208 and combiner 210, are, in some embodiments, considered to be a power amplifier assembly 205. Power source/signal source 202 includes a power source 216, an output resistance 218 ($Z=50\Omega$), and output terminal 220. The power/signal source 202 generates and sends RFIN signal 221, via output terminal 110, to the input port (Port 1) 222 of the uneven power splitter 204. The uneven power splitter 204 includes input port (P1) 222 and two output ports, which are Port 2 (P2) 224 and Port 3 (P3) 226. Port 2 224 of the uneven power splitter 204 is coupled to the input 228 of the 1st power amplifier 206. Port 3 226 of the uneven power splitter 204 is coupled to the input 230 of the 2nd power amplifier 208. In the example of FIG. 2, the 1st power amplifier 206, which is the main power amplifier of the circuit 200, is powered by supply voltage Vdd, m, is biased as a class B power amplifier, and receives 33.3% of the power from the uneven power splitter 204, while 2nd power amplifier 208, which is the auxiliary power amplifier of circuit 200, is biased as a class C power amplifier, and receives 66.7% of the power from the uneven power splitter 204. The output 232 of the 1st power amplifier 206 is coupled to a first input 236 of the combiner 210. The output 234 of the 2nd power amplifier 208 is coupled to a second input 238 of the combiner 210. The combiner 210 combines output signals from the PAs (206, 208) which were received on the first and second inputs (236, 238), and sends a generated combined output signal via output 240 to the load RL 212.

Because of the uneven power splitting between the main PA 206 and auxiliary PA 208, the turning on of the auxiliary PA 208 can be, and is in accordance with a feature of some embodiments of the present invention, accurately controlled by the power split ratio of the uneven power splitter 204. The auxiliary PA 208 can be, and is in accordance with a feature of some embodiments of the present invention, turned on just when the main PA 206 compresses, keeping the overall gain flat.

FIG. 2 further includes gain vs input power (Pin) plot 250 which illustrates the improvement of using an uneven power splitter 204, in accordance with a feature of some embodiments, of the present invention, as compared to the conventional approach of not using an uneven power splitter, e.g. using a power splitter such a power splitter 104 which splits the power evenly between the two amplifiers 206, 208 of different classes. Vertical axis 252 of plot 250 represents gain, while horizontal axis 254 of plot 250 represents input power. Result line 254 shows the characteristic of gain vs input power for the case without uneven power splitter 204, which is non-linear and changes significantly. Result line 256 shows the characteristic of gain vs input power for the case of using the uneven power splitter 204, which is linear and is a flat line, thus the gain for the combined amplifier is controlled to be constant (as desired) as input power is varied.

Figure 3:
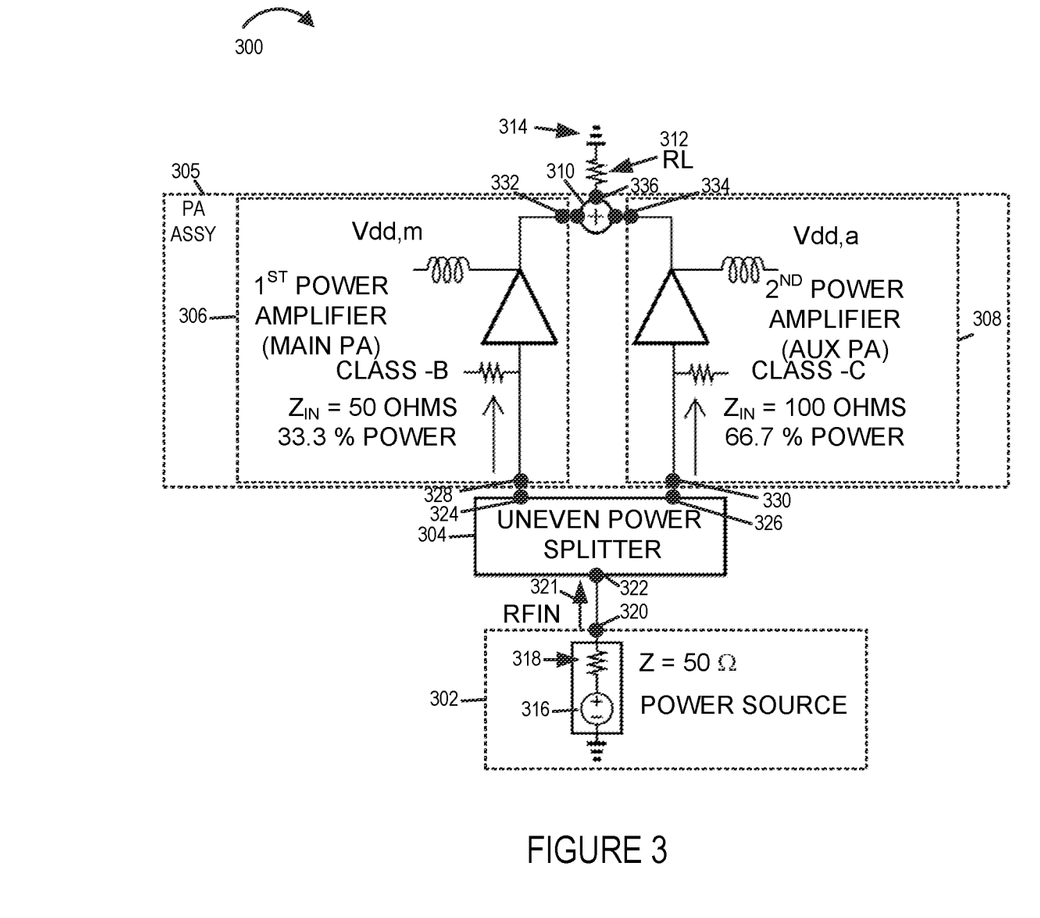
FIG. 3 includes a drawing of an exemplary power amplifier circuit assembly including an uneven power splitter and a power amplifier assembly, which have been co-designed, for AM-AM linearization and to accommodate PA input impedances which do not match the output impedance of the power signal source, in accordance with an exemplary embodiment.

FIG. 3 includes a drawing of an exemplary power amplifier circuit assembly 300 in accordance with an exemplary embodiment. Exemplary power amplifier circuit assembly 300 includes an uneven power splitter 304 and a power amplifier assembly 305, which have been co-designed, for AM-AM linearization and to accommodate PA input impedances which do not match the output impedance of the power signal source 302. Exemplary power amplifier circuit assembly 300 includes a power source/signal source 302, uneven power splitter 304, a 1st power amplifier 306, a 2nd power amplifier 308, a combiner 310 and load resistance RL 310 coupled together and to ground 314 as shown. The 1st power amplifier 306, 2nd power amplifier 308 and combiner 310, are, in some embodiments, considered to be a power amplifier assembly 305. Power source/signal source 302 includes a power source 316, an output resistance 318 (Z=50Ω), and output terminal 320. The power/signal source 302 generates and sends RFIN signal 321, via output terminal 320, to the input port (Port 1) 322 of the uneven power splitter 304. The uneven power splitter 304 includes input port (P1) 322 and two output ports, which are Port 2 (P2) 324 and Port 3 (P3) 326. Port 2 324 of the uneven power splitter 304 is coupled to the input 328 of the 1st power amplifier 306. Port 3 326 of the uneven power splitter 304 is coupled to the input 330 of the 2nd power amplifier 308. In the example of FIG. 3, the 1st power amplifier 306, which is the main power amplifier of the circuit 300, is powered by supply voltage Vdd, m, is biased as a class B power amplifier, receives 33.3% of the power from the uneven power splitter 304 and has an input impedance Zin=50Ω, while 2nd power amplifier 308, which is the auxiliary power amplifier of circuit 300, is biased as a class C power amplifier, receives 66.7% of the power from the uneven power splitter 304 and has an input impedance Zin=100Ω. The output 332 of the 1st power amplifier 306 is coupled to a first input 336 of the combiner 310. The output of the 2nd power amplifier 308 is coupled to a second input 338 of the combiner 310. The combiner 310 combines output signals from the PAs (306, 308) which were received on the first and second input (336, 338), and sends a generated combined output signal via output 340 to the load RL 312.

It is often desirable to match a PA's input impedance to impedances that are different from 50 ohms. On reason is that choosing another impedance may, and sometimes does, reduce the number of components in a matching network, thus reducing power loss and area (e.g. smaller size to implement). Another reason is bandwidth considerations (e.g., accommodating a wide bandwidth), as steeper impedance transformation ratios result in narrower bandwidth. In the exemplary embodiment of power amplifier circuit 300 of FIG. 3, the uneven power splitter 304 is co-designed with the PAs (306, 308) of power amplifier assembly 305, with the uneven phase splitter accommodating non 50 ohm input impedances of one or more of the power amplifiers (306, 308). In the example of circuit 300 of FIG. 3, the input impedance of auxiliary power amplifier 308 is 100 ohms which does not match the output impedance of 50 ohms of the power source/signal source 302 which is an input to the uneven power splitter 304.

Figure 4:
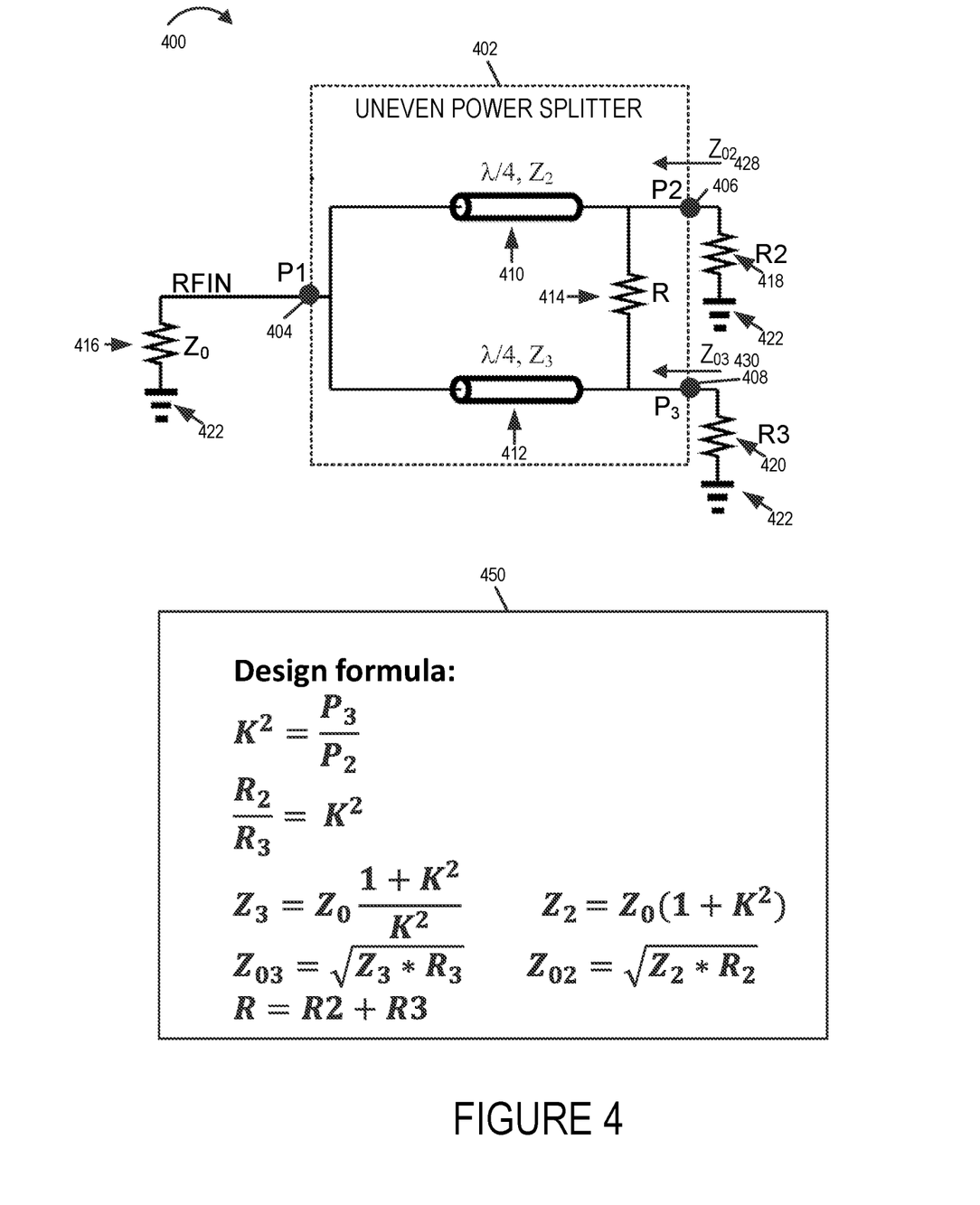
FIG. 4 is a circuit drawing and corresponding set of design formulas used to illustrate a power amplifier and uneven power splitter codesign in accordance with an exemplary embodiment.

FIG. 4 is a circuit drawing 400 and corresponding set of design formulas 450 used to illustrate power amplifier and uneven power splitter codesign in accordance with an exemplary embodiment.

Circuit 400 includes uneven power splitter 402, impedance Zo 416, impedance R2 418, and impedance R3 420 coupled together as shown. The uneven power splitter 402 includes Port 1 (P1) 404, Port 2 (P2) 406, Port 3 (P3) 408, first transmission line 410, second transmission line 412, and resistance R 414. The first transmission line 410 is a quarter wavelength (λ/2) transmission line with impedance Z2. The second transmission line 412 is a quarter wavelength (λ/4) transmission line with impedance Z3. A first end of first transmission line 410 is connected to Port 1 (P1) 404, and a second end of first transmission line 410 is connected to Port 2 (P2) 406. A first end of second transmission line 412 is connected to Port 1 (P1) 404, and a second end of second transmission line 412 is connected to Port 3 (P3) 408. A first lead of resistor R 414 is connected to port 2 (P2) 406, while a second lead of resistor R 414 is connected to port 3 (P3) 408.

Impedance Z0 416 is connected between Port P1 (404) and ground 422. Impedance Z0 represents the output impedance of the device coupled to Port 1 (P1) 404 (the input port) of the uneven power splitter 402 which is providing the input signal RFIN to Port 1 (P1) 404 of the uneven power splitter 404.

Impedance R2 418 is connected between Port 2 (P2) 406 (an output port) and ground 422. Impedance R3 420 is connected between Port 3 (P3) 408 (another output port) and ground 422.

Z02 428 is the output impedance of the uneven power amplifier 402 looking into port 2 (P2) 406. Z03 430 is the output impedance of the uneven power amplifier 402 looking into port 3 (P3) 408.

The power ratio between Port 3 (P3) 408 (with impedance R3 420) and Port 2 (P2) 406 (with impedance R2) is: K2=P3/P2, where P2 is the port 2 power and P3 is the port 3 power. Here it is assumed that impedances R2 and R3 are the input impedances of the main PA and auxiliary PA, and can be engineered to ease the uneven power splitter performance.

The exemplary uneven power splitter 402, in accordance with an embodiment of the present invention, can, and does, achieve accurate power split ratios, controlling the power sent to Port 2 (P2) 406 and Port 3 (P3) 408, while achieving impedance matching with the PAs at Port 2 (P2) 406 and Port 3 (P3) 408.

The exemplary uneven power splitter 402, in accordance with an embodiment of the present invention, doesn't require impedance at Port 2 (P2) 406 and Port 3 (P3) 408 to be specific values and can be, and sometimes is, co-designed with the PAs for benefit.

For example, the choice of R2 418 and R3 420 (which are the input impedances of the main PA and the auxiliary PA), in some embodiments, are made to ease the PA input matching and reduce the number of passive components in those input matching networks.

As another example, in some embodiments, the choice of R2 418 and R3 420 (which are the input impedances of the main PA and the auxiliary PA), are also used to achieve wide bandwidth. Wide bandwidth or wideband in the context of this application is intended to mean above 5% fractional bandwidth.

In various embodiments, the following design formulas are used to determine the values of the co-designed uneven power splitter and amplifier assembly including a main amplifier and an auxiliary amplifier.

$$K^2 = \frac{P_3}{P_2}$$

$$\frac{R_2}{R_3} = K^2$$

$$Z_3 = Z_0 \frac{1+K^2}{K^2} \quad Z_2 = Z_0(1+K^2)$$

Design formula

-continued $$Z_{03} = \sqrt{Z_3 * R_3} \quad Z_{02} = \sqrt{Z_2 * R_2}$$
$$R = R2 + R3$$

Figure 5:
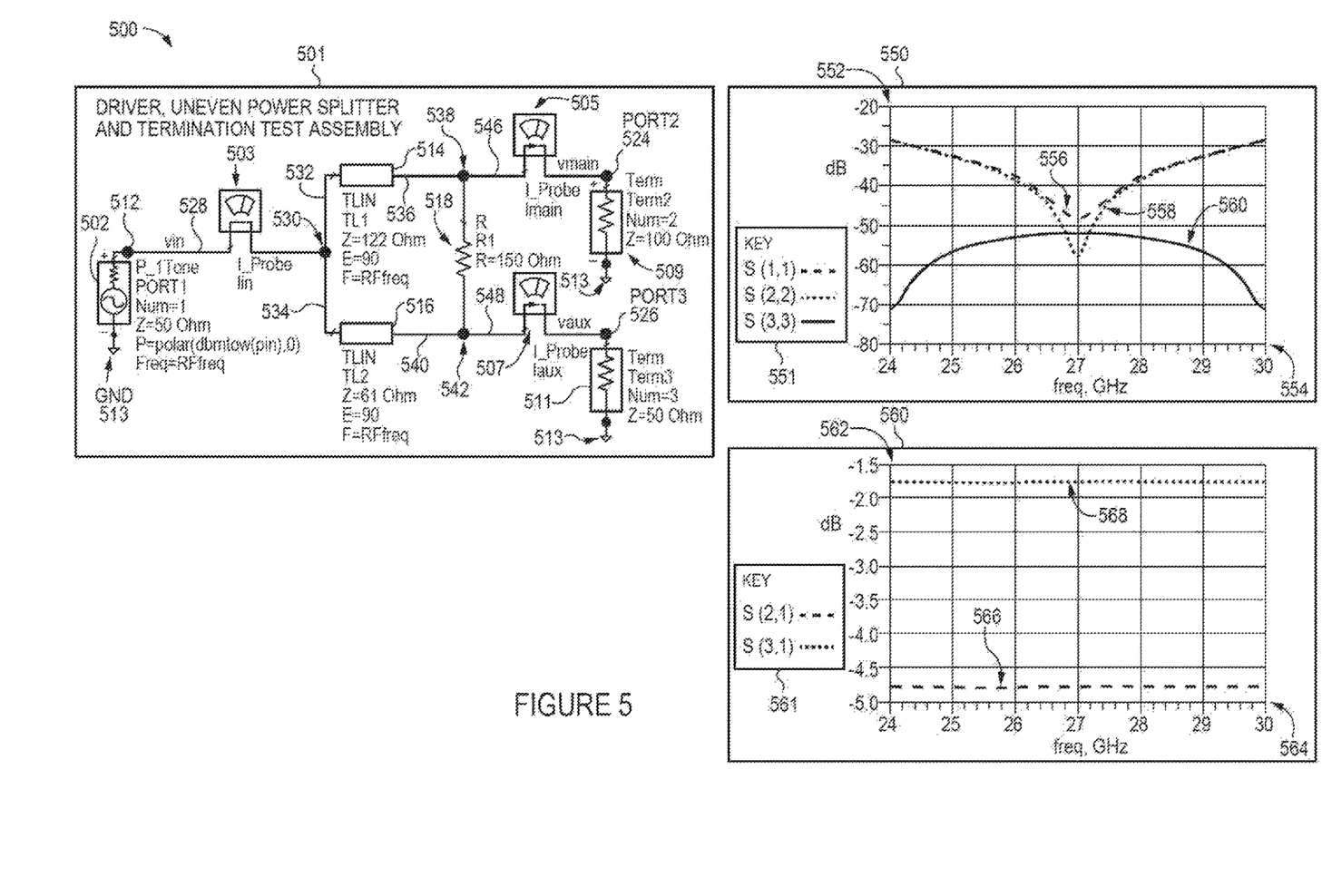
FIG. 5 is a drawing including an exemplary driver, uneven power splitter and termination test assembly and corresponding scattering parameter (S-parameter) results plots in accordance with an exemplary embodiment.

FIG. 5 is a drawing 500 including an exemplary driver, uneven power splitter and termination test assembly 501 and corresponding scattering parameter (S-parameter) results plots 550, 560 in accordance with an exemplary embodiment. The uneven power splitter of assembly 501 includes Port 1 512, Port 2 524, Port 3 526, first transmission line TL1 514, second transmission line TL2 516, resistor R1 518, termination 2 509, and termination 3 511 coupled together as shown. The driver 502 includes a power source and has an output resistance Z=50 ohms. The output of driver 502 is connected to Port 1 512 of the uneven splitter. The voltage across Port 1 512 with respect to ground 513 is Vin. There is a connection path 528 between Port 1 512 and a branch point 530 within the uneven splitter, and current probe 503 measures the input current Iin thru this connection path 528. Thus, the input power can be obtained from (Vin)(Iin). There is a connection path 532 from branch point 530 to a first end of transmission line TL1 514. TL1 514 has an impedance of 122 ohms with a phase angle E=90 degrees. There is a connection path 534 from branch point 530 to a first end of transmission line TL2 516. TL2 516 has an impedance of 61 ohms with a phase E=90 degrees.

There is a connection path 536 from a second end of transmission line TL1 514 to junction point 538. There is a connection path 540 from a second end of transmission line TL2 516 to junction point 542. Resistor R1 518, having a resistance of 150 ohms, is connected across junction points 538, 542.

Connection path 546 connects junction point 538 to Port 2 524. Current probe 505 along connection path 546 measures current Imain. Connection path 548 connects junction point 542 to Port 3 526. Current probe 507 along connection path 548 measures current Iaux.

Termination 2 509, which has a value Z=100 ohms, is placed across Port 2 524 and ground 513. Termination 2 509 represents an input impedance of a main amplifier. The voltage across termination 2 509 with respect to ground 513 is referred to as Vmain. The power to the main amplifier is (Vmain)(Imain).

Termination 3 511, which has a value Z=50 ohms, is placed across Port 3 526 and ground 513. Termination 3 511 represents an input impedance of an auxiliary amplifier. The voltage across termination 3 511 with respect to ground 513 is referred to as Vaux. The power to the auxiliary amplifier is (Vaux)(Iaux).

S-parameter results plot 550 includes a vertical axis 552 representing S-parameter values in units of dBs, and a horizontal axis 554 representing frequency in GHz. Box 551 includes a key indicating: i) a dashed line corresponds to scattering parameter S(1,1), ii) a dotted line corresponds to scattering parameter S(2,2), and iii) a solid line corresponds to scattering parameter S(3,3). Line 556 represents the S(1,1) parameter. Line 558 represents the S(2,2) parameter. Line 560 represents the S(3,3) parameter.

S-parameter results plot 560 includes a vertical axis 562 representing S-parameter values in units of dBs, and a horizontal axis 564 representing frequency in GHz. Box 561 includes a key indicating: i) a dashed line corresponds to scattering parameter S(2,1), and ii) a dotted line corresponds to scattering parameter S(3,1).

For a power ratio of P3/P2=2 (3 dB), the exemplary uneven power splitter of assembly 501 of FIG. 5 accurately controls the S(3,1) parameter to be −4.77 dB and the S(2,1) parameter to be −1.76 dB (3 dB difference) while allowing PA impedances of 100 ohms and 50 ohms.

From the S-parameter results shown in plots 550 and 560, the exemplary uneven power splitter of assembly 501 of FIG. 5, implemented in accordance with some embodiments of the present invention, is wideband. Wide bandwidth or wideband in the context of this application is intended to mean above 5% fractional bandwidth.

Figure 6:
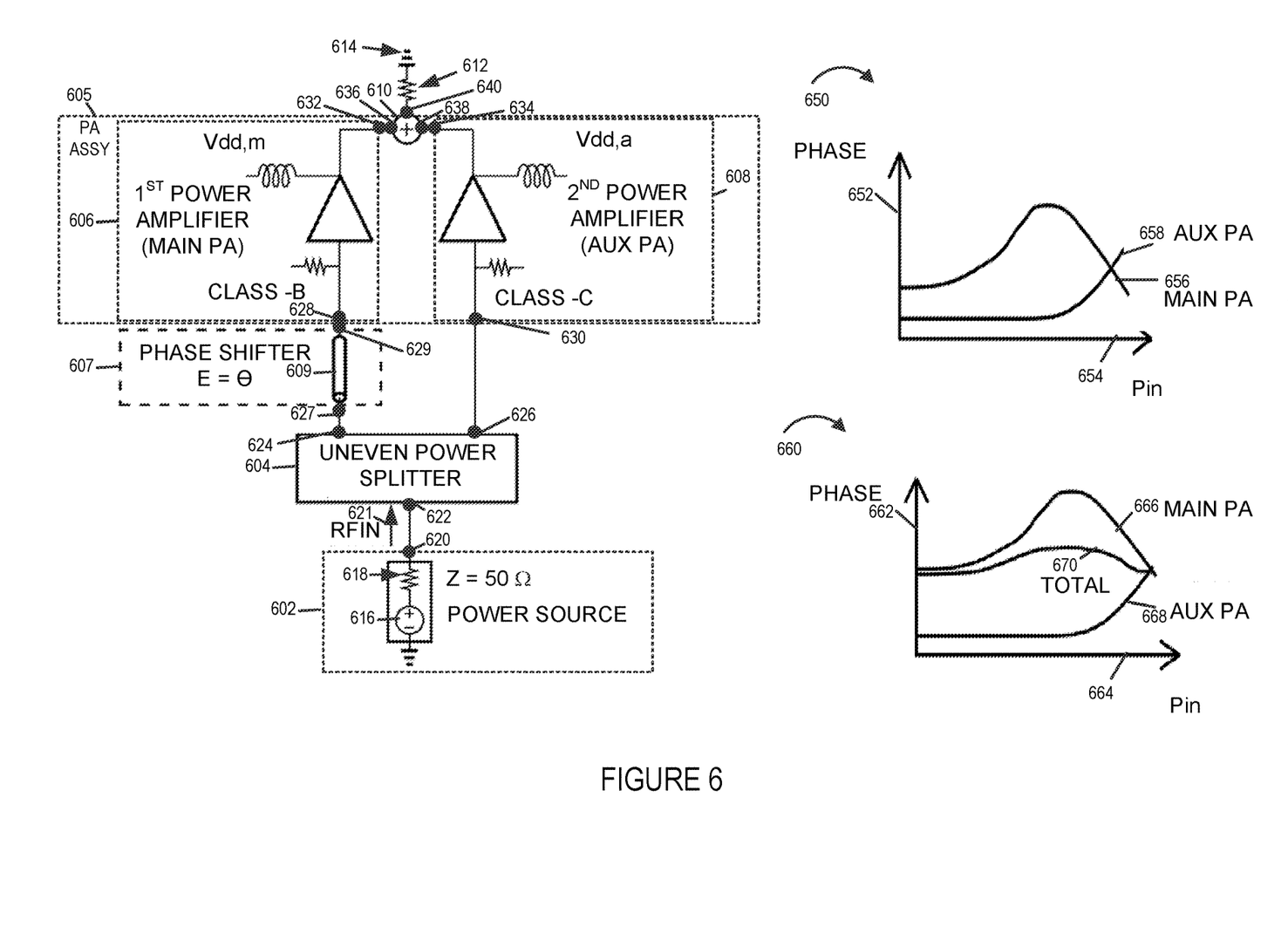
FIG. 6 includes a drawing of an exemplary power amplifier circuit assembly which includes an uneven power splitter and a power amplifier assembly, e.g., which have been co-designed, for AM-AM linearization and to accommodate PA input impedances which do not match the output impedance of the power signal source, and which further includes an additional phase shifter, e.g., a phase adjustment transmission line, in accordance with an exemplary embodiment.

FIG. 6 includes a drawing of an exemplary power amplifier circuit assembly 600 in accordance with an exemplary embodiment. Exemplary power amplifier circuit assembly 600 includes an uneven power splitter 604 and a power amplifier assembly 605, e.g. which have been co-designed, for AM-AM linearization and to accommodate PA input impedances which do not match the output impedance of the power signal source 602, and circuit assembly 600 further includes an additional phase shifter 607, e.g., a phase adjustment transmission line 609. Exemplary power amplifier circuit assembly 600 includes a power source/signal source 602, uneven power splitter 604, phase shifter 607, a 1st power amplifier 606, a 2nd power amplifier 608, a combiner 610 and load resistance RL 610 coupled together and to ground 614 as shown. The 1st power amplifier 606, 2nd power amplifier 608 and combiner 610, are, in some embodiments, considered to be a power amplifier assembly 605. Power source/signal source 602 includes a power source 616, an output resistance 618 (Z=50Ω), and output terminal 620. The power/signal source 602 generates and sends, via output terminal 620, RFIN signal 621 to the input port (Port 1) 622 of the uneven power splitter 604. The uneven power splitter 604 includes input port (P1) 622 and two output ports, which are Port 2 (P2) 624 and Port 3 (P3) 626. Port 2 624 of the uneven power splitter 604 is coupled to a first terminal 627 (input terminal) of phase shifter 607. Phase shifter 607 includes a transmission line 609 which couples the first terminal 607 to a second terminal 629 (output terminal) of the phase shifter 607. Phase shifter 607 changes the phase of an input signal by phase angle E=θ. The second terminal 629 (output terminal) of phase shifter 607 is coupled to the input 628 of the 1st power amplifier 606. Port 3 626 of the uneven power splitter 604 is coupled to the input 630 of the 2nd power amplifier 608. In the example of FIG. 6, the 1st power amplifier 606, which is the main power amplifier of the circuit 600, is powered by supply voltage Vdd, m, is biased as a class B power amplifier, while 2nd power amplifier 608, which is the auxiliary power amplifier of circuit 600, is biased as a class C power amplifier. The output 632 of the 1st power amplifier 606 is coupled to a first input 636 of the combiner 610. The output of the 2nd power amplifier 608 is coupled to a second input 638 of the combiner 610. The combiner 610 combines output signals from the PAs (606, 608) which were received on the first and second input (636, 638), and sends a generated combined output signal via output 640 to the load RL 612.

The extra transmission-Line (t-Line) 609 is chosen to meet both auxiliary PA 608 and main PA 604 phases at the peak output power and linearize AM-PM performance. AM stands for amplitude modulation. PM stands for phase modulation. The AM-PM represents, for the input amplitude to output phase conversion, a measure of the deviation of phase on different power levels. At power back-off, because of the power from main PA is much larger, the phase is dominated by the main PA.

FIG. 6 further includes phase vs input power (Pin) plots 650, 660. Vertical axis 652 of plot 650 represents phase while horizontal axis 654 of plot 650 represents input power (Pin). Line 656 represents the phase vs input power characteristic of the main PA 606, while line 658 represents the phase vs input power characteristic of the auxiliary PA 608.

Vertical axis 662 of plot 660 represents phase while horizontal axis 664 of plot 660 represents input power (Pin). Line 666 represents the phase vs input power characteristic of the main PA 606, while line 668 represents the phase vs input power characteristic of the auxiliary PA 608. Line 670 represents the total phase vs input power characteristic for the combination of the main PA 606, auxiliary PA 608 and phase shifter 607.

In some embodiments, the phase shifter 607 is included as part of the uneven power splitter, e.g., the phase shifter 607 is incorporated into the uneven power splitter 604 with Port 2 of the uneven power splitter becoming terminal 629.

Figure 7:
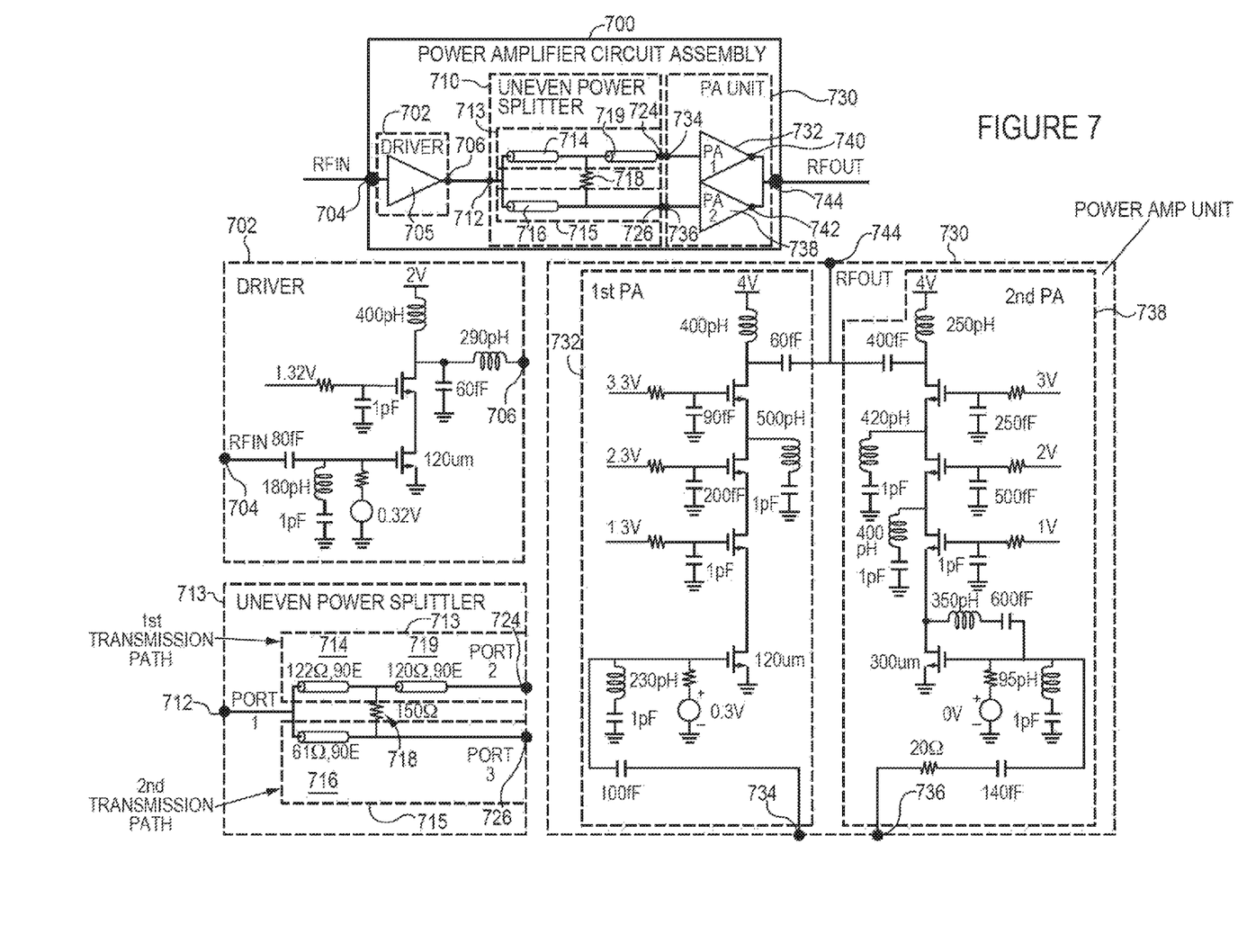
FIG. 7 is drawing of an exemplary power amplifier circuit assembly in accordance with an exemplary embodiment, said power amplifier circuit assembly including a driver, a uneven power splitter, and a power amplifier unit including a first amplifier of a first class, e.g. class-B, and a second amplifier of a second class, e.g. class-C, in accordance with an exemplary embodiment.

FIG. 7 is drawing of an exemplary power amplifier circuit assembly 700 in accordance with an exemplary embodiment. Power amplifier circuit assembly 700 includes a driver 702, a uneven power splitter 710, and a power amplifier unit 730 coupled together as shown. Driver 702 includes an input 704 and an output 706.

The uneven power splitter 710 including a power splitter signal input 712 (e.g., Port 1) for receiving a signal to be amplified, a first power splitter output 724 (e.g., Port 2) and a second power splitter output 726 (e.g., Port 3), said uneven power splitter 710 providing different amounts of power from an input signal received at said power splitter signal input 712 to said first and second power splitter outputs 724, 726.

The power amplifier unit 730 includes a first power amplifier 732 having a first power amplifier input 734 and a first power amplifier output 740, the first power amplifier input 734 being coupled to the first power splitter output 724. The power amplifier unit 730 further includes a second power amplifier 738 having a second power amplifier input 736 coupled to the second power splitter output 736 and a second power amplifier output 742, said first power amplifier output 740 and the second power amplifier output 744 being coupled to each other and to a signal output 744 of the power amplifier circuit assembly 700, said second power amplifier 738 being a different class amplifier than said first power amplifier 732. In some embodiments, said first power amplifier 732 is a class-B power amplifier and said second power amplifier 738 is a class-C power amplifier.

In some embodiments, the outputs (740, 742) of said first and second power amplifiers (732, 738) are coupled together and to the output (744) of said power amplifier circuit assembly (700) without the introduction of a longer delay from the output (740 or 742) of one of the amplifiers (732 or 738) than the other one of the amplifiers (732 or 738) (e.g., without the use of a transmission line which normally intentionally introduced a ¼ wavelength transmission delay as is commonly the case in a Doherty PA).

In some embodiments, the uneven power splitter 710 includes: a first transmission path 713 including a first impedance 714 coupling the power splitter signal input 712 to the first power splitter output 724; and a second transmission path 715 including a second impedance 716 coupling the power splitter signal input 712 to the second power splitter output 726, the first and second impedances (714, 716) being different.

In some embodiments, the first impedance 714 is a first transmission line impedance; and
    the second impedance 716 is a second transmission line impedance.

In some embodiments, first transmission path 713 is implemented using one or more of a i) a capacitor, ii) a resistor, or iii) an inductor (e.g., to simulate a first transmission line having the first impedance (e.g., a first pi model equivalent circuit to a first transmission line having the first transmission line impedance)); and the second transmission path 715 is implemented using one or more of a i) a capacitor, ii) a resistor, or iii) an inductor (e.g. to simulate a transmission line having the second impedance (e.g., a first pi model equivalent circuit to a second transmission line having the second transmission line impedance)). In some embodiments, first impedance 714 is lower than said second impedance 716.

The uneven power splitter 710 further includes: a resistor 718 bridging the first and second transmission paths (713, 715).

In some embodiments, one of said first and second transmission paths (713, 715) includes a phase delay element 719 not included in the other one of said first and second transmission paths (713, 715). In FIG. 7, phase delay element 719 is shown for the example in which the phase delay element is located in first transmission path 713.

In some embodiments, the phase delay element 719 is a transmission line. In some other embodiments, the phase delay element 719 is implemented using one or more of a i) a capacitor, a resistor or iii) an inductor.

In some embodiments, the phase delay element 719 balances (e.g., is equal and opposite) a phase difference introduced between the first and second power amplifiers (732, 738) due to a difference in amplifier size and biasing between the first and second power amplifiers (732, 738).

The power amplifier circuit assembly 700 further includes a power amplifier circuit assembly input 704 for receiving said input signal (e.g., RFIN); and signal driver 702 coupling the power amplifier circuit assembly input 704 to the power splitter input 712, the signal driver 702 including a amplifier 705 for amplifying the input signal prior to it being supplied to the input 712 of the uneven power splitter 710.

FIG. 7 further includes schematic drawings illustrating an exemplary driver 702, an exemplary uneven power splitter 713 and an exemplary power amplifier unit 730, which include exemplary components and component values for one exemplary embodiment. FIG. 7 produces a schematic of an exemplary design. In the layout, the transmission lines (714, 716, 719) can be, and in some embodiments, are, replaced by their equivalent lumped pi model, e.g. to save area. The 120 Ohms 90 degree T-line (719) in the uneven power splitter 719 is used for balancing the phase difference between the two PAs (732, 738) due to different sizing and/or biasing.

Figure 8:
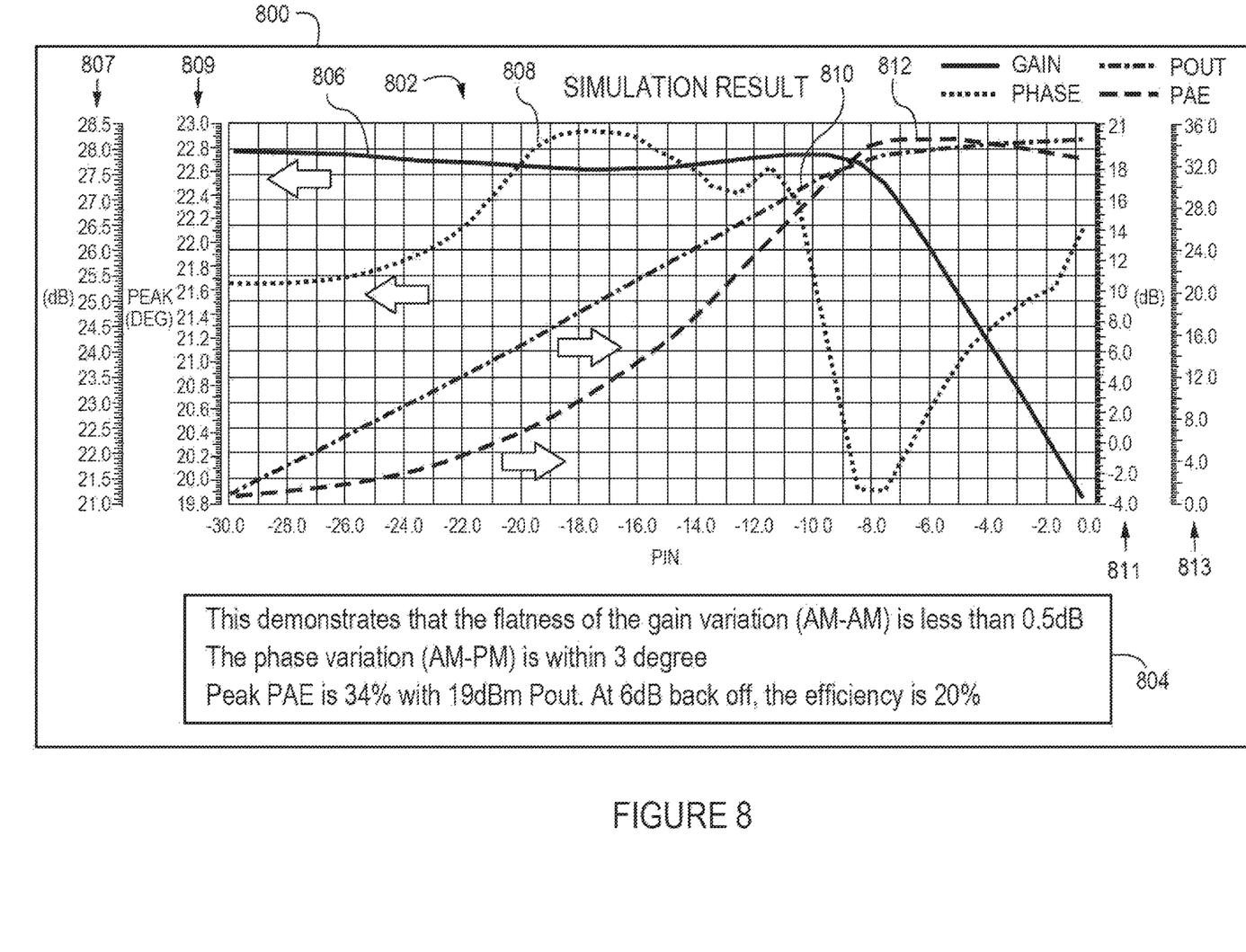
FIG. 8 is a drawing of a simulation result of performance for an exemplary power amplifier circuit assembly in accordance with an exemplary embodiment.

FIG. 8 is a drawing 800 including a simulation results plot 802 of performance for an exemplary power amplifier circuit assembly in accordance with an exemplary embodiment and corresponding results summary information 804. The horizontal axis of simulation results plot 802 represents input power (Pin). Solid line 806 on plot 802 is a representation of gain vs input power (Pin) with vertical axis grid 807 being used to indicate gain in dBs. Solid line 806 on plot 802 is a representation of gain vs input power (Pin) with vertical axis grid 807 being used to indicate gain in dBs. Dotted line 808 on plot 802 is a representation of phase vs input power (Pin) with vertical axis grid 808 being used to indicate peak phase in degrees. Dash-dot line 810 on plot 802 is a representation of output power (Pout) vs input power (Pin) with vertical axis grid 811 being used to indicate output power in dBs. Dashed line 812 on plot 802 is a representation of peak-added efficiency (PAE) vs input power (Pin) with vertical axis grid 813 being used to indicate PAE percentage values.

Simulation results plot 802 illustrates that the flatness of the gain variation (AM-AM) is less than 0.5 dB, the phase variation (AM-PM) is within 3 degrees, and the peak Power-Added Efficiency (PAE) is 34% with 19 dBM Pout; and at 6 dB back off, the efficiency is 20%, as indicated in results summary information 804.

Numbered List of Exemplary Apparatus Embodiments

Apparatus Embodiment 1. A power amplifier circuit assembly (700) comprising: an uneven power splitter (710) including a power splitter signal input (712) (e.g., Port 1) for receiving a signal to be amplified, a first power splitter output (724) (e.g., Port 2) and a second power splitter output (726) (e.g., Port 3), said uneven power splitter (710) providing different amounts of power from an input signal received at said power splitter signal input (712) to said first and second power splitter outputs (724, 726); a first power amplifier (732) having a first power amplifier input (734) and a first power amplifier output (740), the first power amplifier input (734) being coupled to the first power splitter output (724); and a second power amplifier (738) having a second power amplifier input (736) coupled to the second power splitter output (726) and a second power amplifier output (742), said first power amplifier output (740) and the second power amplifier output (742) being coupled to each other and to a signal output (744) of the power amplifier circuit assembly (700), said second power amplifier (738) being a different class amplifier than said first power amplifier (732).

Apparatus Embodiment 2. The power amplifier circuit assembly (700) of Apparatus Embodiment 1, wherein the outputs (740, 742) of said first and second power amplifiers (732, 738) are coupled together and to the output (744) of said power amplifier circuit assembly (700) without the introduction of a longer delay from the output (740 or 742) of one of the amplifiers (732 or 738) than the other one of the amplifiers (732 or 738) (e.g., without the use of a transmission line which normally intentionally introduced a ¼ wavelength transmission delay as is commonly the case in a Doherty PA).

Apparatus Embodiment 3. The power amplifier circuit assembly (700) of Apparatus Embodiment 1, wherein the uneven power splitter (710) includes: a first transmission path (713) including a first impedance (714) coupling the power splitter signal input (712) to the first power splitter output (724); and a second transmission path (715) including a second impedance (716) coupling the power splitter signal input (712) to the second power splitter output (726), the first and second impedances (714, 716) being different.

Apparatus Embodiment 3A. The power amplifier circuit assembly (700) of Apparatus Embodiment 1, wherein the first impedance (714) is a first transmission line impedance; and wherein the second impedance (716) is a second transmission line impedance.

Apparatus Embodiment 3B. The power amplifier circuit assembly (700) of Apparatus Embodiment 3, wherein said first transmission path (713) is implemented using one or more of a i) a capacitor, ii) a resistor, or iii) an inductor (e.g., to simulate a first transmission line having the first impedance (e.g., a first pi model equivalent circuit to a first transmission line having the first transmission line impedance)); and wherein said second transmission path (715) is implemented using one or more of a i) a capacitor, ii) a resistor, or iii) an inductor (e.g. to simulate a transmission line having the second impedance (e.g., a first pi model equivalent circuit to a second transmission line having the second transmission line impedance)).

Apparatus Embodiment 4. The power amplifier circuit assembly (700) of Apparatus Embodiment 2, wherein said first power amplifier (732) is a class-B power amplifier and said second power amplifier (738) is a class-C power amplifier.

Apparatus Embodiment 5. The power amplifier circuit assembly (700) of Apparatus Embodiment 4, wherein the first impedance (714) is lower than said second impedance (716).

Apparatus Embodiment 6. The power amplifier circuit assembly (700) of Apparatus Embodiment 4, wherein the second impedance (714) is lower than said first impedance (716).

Apparatus Embodiment 7. The power amplifier circuit assembly (700) of Apparatus Embodiment 3, wherein the uneven power splitter (710) further includes: a resistor (718) bridging the first (713) and second (715) transmission paths.

Apparatus Embodiment 8. The power amplifier circuit assembly (700) of Apparatus Embodiment 7, wherein one of said first and second transmission paths (713, 715) includes a phase delay element (719) not included in the other one of said first and second transmission paths (713, 715).

Apparatus Embodiment 8A. The power amplifier circuit (700) of Apparatus Embodiment 8, wherein said phase delay element (719) is a transmission line.

Apparatus Embodiment 8B. The power amplifier circuit (700) of Apparatus Embodiment 8, wherein said phase delay element (719) is implemented using one or more of a i) a capacitor, ii) a resistor or iii) an inductor.

Apparatus Embodiment 9. The power amplifier circuit assembly (700) of Apparatus Embodiment 8 wherein the phase delay element (719) balances (e.g., is equal and opposite) a phase difference introduced between the first and second power amplifiers (732, 738) due to a difference in amplifier size and biasing between the first and second power amplifiers (732, 738).

Apparatus Embodiment 10. The power amplifier circuit assembly (700) of Apparatus Embodiment 8, further comprising: a power amplifier circuit assembly input (704) for receiving said input signal; and a signal driver (702) coupling the power amplifier circuit assembly input (704) to the power splitter input (712), the signal driver (702) including a amplifier (705) for amplifying the input signal prior to it being supplied to the input of the uneven power splitter (710).

Apparatus Embodiment 10A. The power amplifier circuit assembly (700) of Apparatus Embodiment 10, wherein the output impedance of the signal driver (702) is different than the input impedance of at least one of the first and second amplifiers (632, 634).

Apparatus Embodiment 10B. The power amplifier circuit assembly (700) of Apparatus Embodiment 3, wherein the overall gain from the input of uneven power spitter (710) to the signal output (744) of the power amplifier circuit assembly is flat. (In at least some embodiments, flat means that the gain variation before compression is less than 1 dB.) (In some such embodiments, the gain variation before compression is less than 0.5 dBs.)

Apparatus Embodiment 10C. The power amplifier circuit assembly (700) of Apparatus Embodiment 3, wherein the uneven power splitter (710) is wideband. (Wide bandwidth or wideband in the context of this application is intended to mean above 5% fractional bandwidth.)

Apparatus Embodiment 10C1. The power amplifier circuit assembly (700) of Apparatus Embodiment 3, wherein wideband is intended to mean above 5% fractional bandwidth.

Apparatus Embodiment 10D. The power amplifier circuit assembly (700) of Apparatus Embodiment 3, wherein said amplifier amplifies signals in the microwave range of 1 GHz to 220 GHz.

Apparatus Embodiment 10E. The power amplifier circuit assembly (700) of Apparatus Embodiment 3, wherein said power amplifier circuit is part of a large antenna array assembly.

The techniques of various embodiments may be implemented using software, hardware and/or a combination of software and hardware. Various embodiments are directed to apparatus and/or systems, e.g., wireless communications systems, wireless terminals, user equipment (UE) devices, access points, e.g., a WiFi wireless access point, a cellular wireless AP, e.g., an eNB or gNB, user equipment (UE) devices, a wireless cellular systems, e.g., a cellular system, WiFi networks, etc. Various embodiments are also directed to methods, e.g., method of controlling and/or operating a system or device, e.g., a communications system, an access point, a base station, a wireless terminal, a UE device, etc. Various embodiments are also directed to machine, e.g., computer, readable medium, e.g., ROM, RAM, CDs, hard discs, etc., which include machine readable instructions for controlling a machine to implement one or more steps of a method. The computer readable medium is, e.g., non-transitory computer readable medium.

It is understood that the specific order or hierarchy of steps in the processes and methods disclosed is an example of exemplary approaches. Based upon design preferences, it is understood that the specific order or hierarchy of steps in the processes and methods may be rearranged while remaining within the scope of the present disclosure. The accompanying method claims present elements of the various steps in a sample order, and are not meant to be limited to the specific order or hierarchy presented. In some embodiments, one or more processors are used to carry out one or more steps of the each of the described methods.

In various embodiments each of the steps or elements of a method are implemented using one or more processors. In some embodiments, each of elements or steps are implemented using hardware circuitry.

In various embodiments nodes and/or elements described herein are implemented using one or more components to perform the steps corresponding to one or more methods, for example, controlling, establishing, generating a message, message reception, signal processing, sending, communicating, e.g., receiving and transmitting, comparing, making a decision, selecting, making a determination, modifying, controlling determining and/or transmission steps. Thus, in some embodiments various features are implemented using components or in some embodiments logic such as for example logic circuits. Such components may be implemented using software, hardware or a combination of software and hardware. Many of the above described methods or method steps can be implemented using machine executable instructions, such as software, included in a machine readable medium such as a memory device, e.g., RAM, floppy disk, etc. to control a machine, e.g., general purpose computer with or without additional hardware, to implement all or portions of the above described methods, e.g., in one or more nodes. Accordingly, among other things, various embodiments are directed to a machine-readable medium, e.g., a non-transitory computer readable medium, including machine executable instructions for causing a machine, e.g., processor and associated hardware, to perform one or more of the steps of the above-described method(s). Some embodiments are directed to a device, e.g., a wireless communications device including a multi-element antenna array supporting beam forming, such as a cellular AP or Wifi AP, a wireless terminal, a UE device, etc., including a processor configured to implement one, multiple or all of the steps of one or more methods of the invention.

In some embodiments, the processor or processors, e.g., CPUs, of one or more devices, are configured to perform the steps of the methods described as being performed by the devices, e.g., communication nodes. The configuration of the processor may be achieved by using one or more components, e.g., software components, to control processor configuration and/or by including hardware in the processor, e.g., hardware components, to perform the recited steps and/or control processor configuration. Accordingly, some but not all embodiments are directed to a device, e.g., access point, with a processor which includes a component corresponding to each of the steps of the various described methods performed by the device in which the processor is included. In some but not all embodiments a device, e.g., wireless communications node such as an access point or base station, includes a component corresponding to each of the steps of the various described methods performed by the device in which the processor is included. The components may be implemented using software and/or hardware.

Some embodiments are directed to a computer program product comprising a computer-readable medium, e.g., a non-transitory computer-readable medium, comprising code for causing a computer, or multiple computers, to implement various functions, steps, acts and/or operations, e.g., one or more steps described above. Depending on the embodiment, the computer program product can, and sometimes does, include different code for each step to be performed. Thus, the computer program product may, and sometimes does, include code for each individual step of a method, e.g., a method of controlling a wireless communications device such as an access point. The code may be in the form of machine, e.g., computer, executable instructions stored on a computer-readable medium, e.g., a non-transitory computer-readable medium, such as a RAM (Random Access Memory), ROM (Read Only Memory) or other type of storage device. In addition to being directed to a computer program product, some embodiments are directed to a processor configured to implement one or more of the various functions, steps, acts and/or operations of one or more methods described above. Accordingly, some embodiments are directed to a processor, e.g., CPU, configured to implement some or all of the steps of the methods described herein. The processor may be for use in, e.g., a wireless communications device such as an access point described in the present application.

Numerous additional variations on the methods and apparatus of the various embodiments described above will be apparent to those skilled in the art in view of the above description. Such variations are to be considered within the scope. Numerous additional embodiments, within the scope of the present invention, will be apparent to those of ordinary skill in the art in view of the above description and the claims which follow. Such variations are to be considered within the scope of the invention.

What is claimed is:

1. A power amplifier circuit assembly comprising:
an uneven power splitter including a power splitter signal input for receiving a signal to be amplified, a first power splitter output and a second power splitter output, said uneven power splitter providing different amounts of power from an input signal received at said power splitter signal input to said first and second power splitter outputs;
a first power amplifier having a first power amplifier input and a first power amplifier output, the first power amplifier input being coupled to the first power splitter output; and
a second power amplifier, having a second power amplifier input, coupled to the second power splitter output, and a second power amplifier output, said first power amplifier output and the second power amplifier output being coupled to each other and to a signal output of the power amplifier circuit assembly, said second power amplifier being a different class amplifier than said first power amplifier;
wherein the uneven power splitter includes a first transmission path and a second transmission path, said first transmission path including a first impedance, said second transmission path including a second impedance, said first transmission path coupling the power splitter signal input to the first power splitter output, said second transmission path coupling the power splitter signal input to the second power splitter output, the first and second impedances being different; and
wherein one of said first and second transmission paths includes a phase delay element not included in the other one of said first and second transmission paths.

2. The power amplifier circuit assembly of claim 1,
wherein the first impedance is a first transmission line impedance; and
wherein the second impedance is a second transmission line impedance.

3. The power amplifier circuit assembly of claim 1,
wherein said first transmission path is implemented using one or more of: i) a capacitor, ii) a resistor, or iii) an inductor; and
wherein said second transmission path is implemented using one or more of: i) a capacitor, ii) a resistor, or iii) an inductor.

4. The power amplifier circuit assembly of claim 1, wherein said first power amplifier is a class-B power amplifier and said second power amplifier is a class-C power amplifier.

5. The power amplifier circuit assembly of claim 4, wherein the first impedance is lower than said second impedance.

6. The power amplifier circuit assembly of claim 4, wherein the second impedance is lower than said first impedance.

7. The power amplifier circuit assembly of claim 1, wherein the uneven power splitter further includes:
a resistor bridging the first and second transmission paths.

8. The power amplifier circuit of claim 1, wherein said phase delay element is a transmission line.

9. The power amplifier circuit of claim 1, wherein said phase delay element is implemented using one or more of: i) a capacitor, ii) a resistor or iii) an inductor.

10. The power amplifier circuit assembly of claim 1, wherein the phase delay element balances a phase difference introduced between the first and second power amplifiers due to a difference in amplifier size and biasing between the first and second power amplifiers.

11. The power amplifier circuit assembly of claim 1, further comprising:
a power amplifier circuit assembly input for receiving an input signal; and
a signal driver coupling the power amplifier circuit assembly input to the power splitter signal input, the signal driver including an amplifier for amplifying the input signal prior to it being supplied to the power splitter signal input of the uneven power splitter.

12. The power amplifier circuit assembly of claim 11, wherein the output impedance of the signal driver is different than the input impedance of at least one of the first and second power amplifiers.

13. The power amplifier circuit assembly of claim 1, wherein the overall gain from the input of uneven power spitter to the signal output of the power amplifier circuit assembly is flat.

14. The power amplifier circuit assembly of claim 1, wherein the uneven power splitter is wideband.

15. The power amplifier circuit assembly of claim 1, wherein wideband is intended to mean above 5% fractional bandwidth.

16. The power amplifier circuit assembly of claim 1, wherein said power amplifier circuit assembly amplifies signals in the microwave range of 1 GHz to 220 GHz.

17. The power amplifier circuit assembly of claim 1, wherein said power amplifier circuit assembly is part of a large antenna array assembly.

* * * * *